United States Patent
Chang et al.

(10) Patent No.: US 10,366,995 B2
(45) Date of Patent: Jul. 30, 2019

(54) SEMICONDUCTOR STRUCTURE AND MANUFACTURING METHOD THEREOF

(71) Applicant: Winbond Electronics Corp., Taichung (TW)

(72) Inventors: Wei-Che Chang, Taichung (TW); Yoshinori Tanaka, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/979,476

(22) Filed: May 15, 2018

(65) Prior Publication Data
US 2019/0006369 A1    Jan. 3, 2019

(30) Foreign Application Priority Data

Jul. 3, 2017  (CN) .......................... 2017 1 0532559

(51) Int. Cl.
*H01L 27/108*    (2006.01)
*H01L 21/762*    (2006.01)
*H01L 29/06*     (2006.01)

(52) U.S. Cl.
CPC .. *H01L 27/10891* (2013.01); *H01L 21/76224* (2013.01); *H01L 27/10823* (2013.01); *H01L 27/10876* (2013.01); *H01L 29/0649* (2013.01)

(58) Field of Classification Search
CPC .......... H01L 27/10891; H01L 27/10823; H01L 27/10876; H01L 29/0649
See application file for complete search history.

(56) References Cited

U.S. PATENT DOCUMENTS

| | | | |
|---|---|---|---|
| 8,975,140 B2 | 3/2015 | Chung | |
| 2012/0286358 A1* | 11/2012 | Sammi | H01L 21/823487 257/334 |
| 2013/0181271 A1* | 7/2013 | Oyu | H01L 27/10823 257/296 |
| 2014/0061939 A1 | 3/2014 | Yu et al. | |

FOREIGN PATENT DOCUMENTS

TW        201230303        7/2012

* cited by examiner

*Primary Examiner* — Matthew L Reames
(74) *Attorney, Agent, or Firm* — JCIPRNET (57) ABSTRACT

A semiconductor structure includes a substrate, and first isolation structures, at least one buried word line and at least one second isolation structure which are disposed in the substrate. The buried word line intersects the first isolation structures. The second isolation structure intersects the first isolation structures. A material of at least a portion of the second isolation structure is different from a material of the first isolation structures.

20 Claims, 12 Drawing Sheets

SEMICONDUCTOR STRUCTURE AND MANUFACTURING METHOD THEREOF

CROSS-REFERENCE TO RELATED APPLICATION

This application claims the priority benefit of China application serial no. 201710532559.2, filed on Jul. 3, 2017. The entirety of the above-mentioned patent application is hereby incorporated by reference herein and made a part of this specification.

BACKGROUND

Technical Field

The invention relates to a semiconductor structure and a manufacturing method thereof, and more particularly to a semiconductor structure including a buried word line and a manufacturing method thereof.

Description of Related Art

In a manufacturing process of a semiconductor device using a buried word line, intersecting isolation structures are formed in a substrate to define active areas. However, during subsequent formation of the buried word line, both a wet cleaning process and a thermal process may expand the isolation structures, leading to size reduction of the active area. Thus, contact area between a contact and the active area is accordingly reduced, leading to an increase in resistance value between the contact and the active area. In this way, when the semiconductor device is applied to a memory, write recovery time of the memory may be increased and an operating speed thereof may be lowered.

In addition, during the formation of the buried word line, a recess is likely to be formed on the isolation structures. Therefore, during subsequent formation of the contact connected to the active area, a conductive material may remain in the recess of the isolation structures, thus causing short circuit between the contacts.

SUMMARY

The invention provides a semiconductor structure and a manufacturing method thereof, by which size reduction of an active area can be effectively prevented, and occurrence of short circuit between contacts can be avoided.

The invention proposes a semiconductor structure, including a substrate, first isolation structures, at least one buried word line and at least one second isolation structure. The first isolation structures are disposed in the substrate. The buried word line is disposed in the substrate. The buried word line intersects the first isolation structures. The second isolation structure is disposed in the substrate. The second isolation structure intersects the first isolation structures. A material of at least a portion of the second isolation structure is different from a material of the first isolation structures. A bottom surface of the at least a portion of the second isolation structure is lower than a top surface of the substrate.

The invention proposes a manufacturing method of a semiconductor structure, the manufacturing method including the following steps. First isolation structures are formed in a substrate. At least one buried word line is formed in the substrate. The buried word line intersects the first isolation structures. After the buried word line is formed, at least one second isolation structure is formed in the substrate. The second isolation structure intersects the first isolation structures.

Based on the above, it is clear that, in the semiconductor structure proposed by the invention, since the material of at least a portion of the second isolation structure is different from the material of the first isolation structures, size reduction of the active area can be effectively prevented, and occurrence of short circuit between the subsequently formed contacts can be avoided. In this way, the semiconductor structure proposed by the invention can effectively reduce write recovery time of a semiconductor device and improve an operating speed thereof. Moreover, product yield can be improved, and performance and production of the semiconductor device can be further improved.

In addition, in the manufacturing method of a semiconductor structure proposed by the invention, since the second isolation structure is formed after the buried word line has been formed, the number of thermal processes that the second isolation structure undergoes can be reduced, and the number of processes that may cause recesses on the second isolation structure can be decreased. Therefore, size reduction of the active area can be effectively prevented, and occurrence of short circuit between the subsequently formed contacts can be avoided. In this way, the manufacturing method of a semiconductor structure proposed by the invention can effectively reduce write recovery time of a semiconductor device and improve an operating speed thereof. Moreover, product yield can be improved, and performance and production of the semiconductor device can be further improved.

To make the above features and advantages of the invention more comprehensible, embodiments accompanied with drawings are described in detail as follows.

DETAILED DESCRIPTION OF DISCLOSED EMBODIMENTS

FIG. 1A to FIG. 1E are top views of a manufacturing process of a semiconductor structure according to an embodiment of the invention. FIG. 2A to FIG. 2E are cross-sectional views taken along section line A-A' in FIG. 1A to FIG. 1E. FIG. 3A to FIG. 3E are cross-sectional views taken along section line B-B' in FIG. 1A to FIG. 1E. FIG. 4A to FIG. 4E are cross-sectional views taken along section line C-C' in FIG. 1A to FIG. 1E. The semiconductor structure of the invention may be implemented in a dynamic random access memory (DRAM).

Referring to FIG. 1A, FIG. 2A, FIG. 3A and FIG. 4A, a first patterned hard mask layer 102 is formed on a substrate 100. The substrate 100 may be a semiconductor substrate such as a silicon substrate.

The first patterned hard mask layer 102, for example, has a bent shape or a straight shape. In the present embodiment, the first patterned hard mask layer 102 has a bent shape. Such bent shape is conducive to an increase in contact area between an active area and a contact that are subsequently formed, so as to reduce a resistance value between the active area and the contact, and further to reduce write recovery time of a semiconductor device, thereby improving an operating speed thereof.

The first patterned hard mask layer 102 may be a multi-layer structure or a single-layer structure. In the present embodiment, the first patterned hard mask layer 102 is a multilayer structure. For example, the first patterned hard mask layer 102 includes a pad oxide layer 104 and a pad nitride layer 106. The pad oxide layer 104 is formed on the substrate 100, and the pad nitride layer 106 is formed on the pad oxide layer 104. A material of the pad oxide layer 104 is, for example, silicon oxide. A material of the pad nitride layer 106 is, for example, silicon nitride. A method for forming the pad oxide layer 104 and the pad nitride layer 106 is, for example, as follows. Firstly, a pad oxide material layer (not illustrated) and a pad nitride material layer (not illustrated) are formed in sequence. Then, a patterning process is performed on the pad oxide material layer and the pad nitride material layer. A method for forming the pad oxide material layer is, for example, a thermal oxidation method. A method for forming the pad nitride material layer is, for example, a chemical vapor deposition (CVD) method.

Next, the substrate 100 is partially removed using the first patterned hard mask layer 102 as a mask, and first openings 108 are formed in the substrate 100. A method for partially removing the substrate 100 is, for example, a dry etching method.

Then, first isolation structures 110 are formed in the first openings 108. Thereby, first isolation structures 110 can be formed in the substrate 100. A material of the first isolation structure 110 is, for example, oxide such as silicon oxide. A method for forming the first isolation structure 110 is, for example, as follows. Firstly, an isolation material layer that fills the first opening 108 is formed. Next, an annealing process is performed on the isolation material layer, and the isolation material layer outside the first opening 108 is then removed. A method for forming the isolation material layer is, for example, a CVD method. A method for removing the isolation material layer outside the first opening 108 is, for example, a chemical mechanical polishing (CMP) method.

Next, referring to FIG. 1B, FIG. 2B, FIG. 3B and FIG. 4B, an etch-back process is optionally performed on the first isolation structure 110, so as to adjust the height of the first isolation structure 110. The etch-back process is, for example, a dry etching process.

Then, the first patterned hard mask layer 102 is optionally removed. In the present embodiment, explanation is given of an example in which the pad nitride layer 106 in the first patterned hard mask layer 102 is removed. A method for removing the pad nitride layer 106 is, for example, a dry etching method.

Figure 4A:
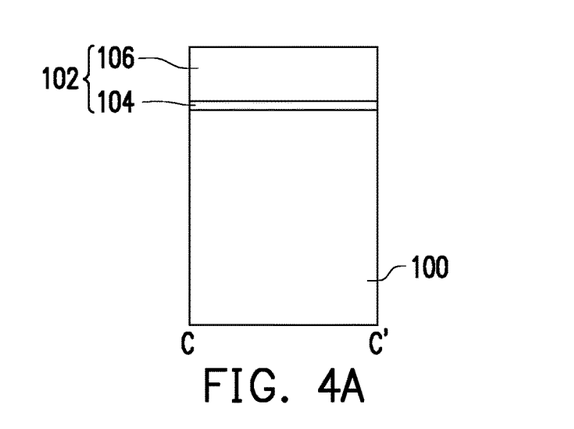
FIG. 4A to FIG. 4E are cross-sectional views taken along section line C-C' in FIG. 1A to FIG. 1E.
Figure 4B:
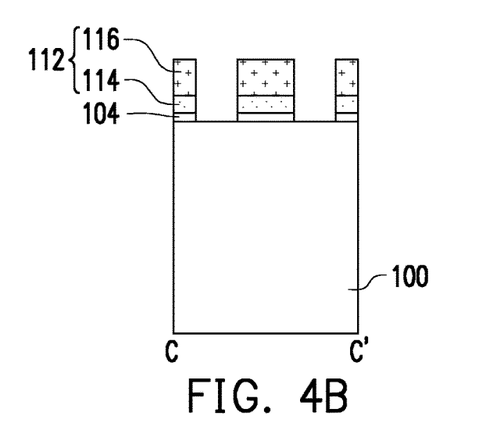
Figure 4C:
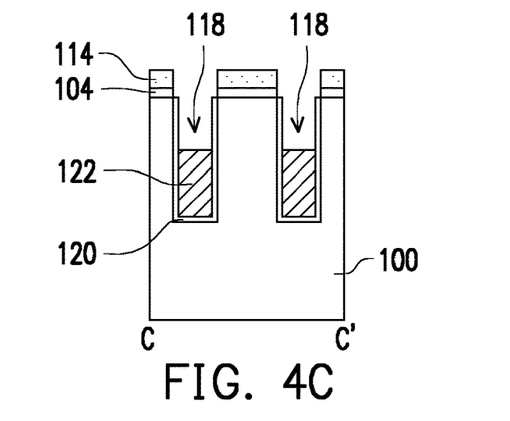
Figure 4D:
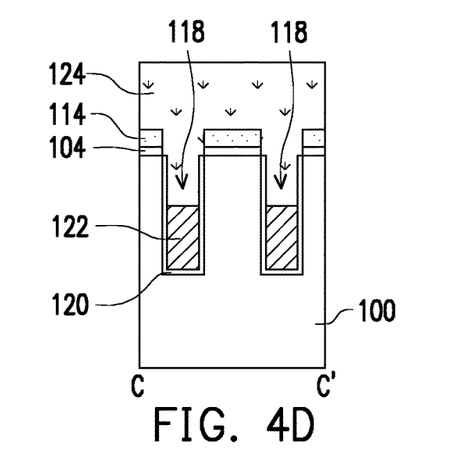

Subsequently, a second patterned hard mask layer 112 is formed on the pad oxide layer 104 above the substrate 100. The second patterned hard mask layer 112 may be a multi-layer structure or a single-layer structure. In the present embodiment, the second patterned hard mask layer 112 is a multilayer structure. For example, the second patterned hard mask layer 112 includes a hard mask layer 114 and a hard mask layer 116. The hard mask layer 114 is formed on the pad oxide layer 104, and the hard mask layer 116 is formed on the hard mask layer 114. In the present embodiment, explanation is given of an example in which a material of the hard mask layer 114 is silicon oxide, and a material of the hard mask layer 116 is silicon carbide. The hard mask layer 114 and the hard mask layer 116 are formed by, for example, a combination of a deposition process and a patterning process. However, the invention is not limited thereto. In other embodiments, the second patterned hard mask layer 112 may be formed by a self-align double patterning (SADP) process. In addition, during formation of the second patterned hard mask layer 112, the pad oxide layer 104 may be partially removed at the same time (as shown in FIG. 4B).

Further, referring to FIG. 1C, FIG. 2C, FIG. 3C and FIG. 4C, the substrate 100 is partially removed using the second patterned hard mask layer 112 as a mask, and at least one second opening 118 is formed in the substrate 100. In addition, during the process of partially removing the substrate 100, the first isolation structure 110 is partially removed at the same time. A method for partially removing the substrate 100 is, for example, a dry etching method. In addition, in the case where silicon carbide is used as the material of the hard mask layer 116, during the process of partially removing the substrate 100, the hard mask layer 116 is removed at the same time.

Then, a gate dielectric layer 120 is formed on a portion of the second opening 118, so as to isolate the substrate 100 from a subsequently formed buried word line 122. A method for forming the gate dielectric layer 120 is, for example, a thermal oxidation method.

Next, the buried word line 122 is formed in the second opening 118. Thereby, at least one buried word line 122 can be formed in the substrate 100. The buried word line 122 intersects the first isolation structure 110. A top surface of the buried word line 122 is, for example, lower than a top surface of the substrate 100. A material of the buried word line 122 is, for example, metal or doped polysilicon, wherein the metal may be tungsten (W), titanium nitride (TiN), or a combination thereof A method for forming the buried word line 122 is, for example, as follows. Firstly, a conductive layer (not illustrated) that fills the second opening 118 is formed. Then, an etch-back process is performed on the conductive layer. A method for forming the conductive layer is, for example, a physical vapor deposition (PVD) method or a CVD method. The etch-back process is, for example, a dry etching process.

Then, referring to FIG. 1D, FIG. 2D, FIG. 3D and FIG. 4D, a patterned photoresist layer 124 is formed on the hard mask layer 114 above the substrate 100. In addition, the patterned photoresist layer 124 can be partially filled into the second opening 118. The patterned photoresist layer 124 may be formed by a lithography process.

Next, the substrate 100 is partially removed using the patterned photoresist layer 124 as a mask, and at least one third opening 126 is formed in the substrate 100. A method for partially removing the substrate 100 is, for example, a dry etching method.

Figure 1A:
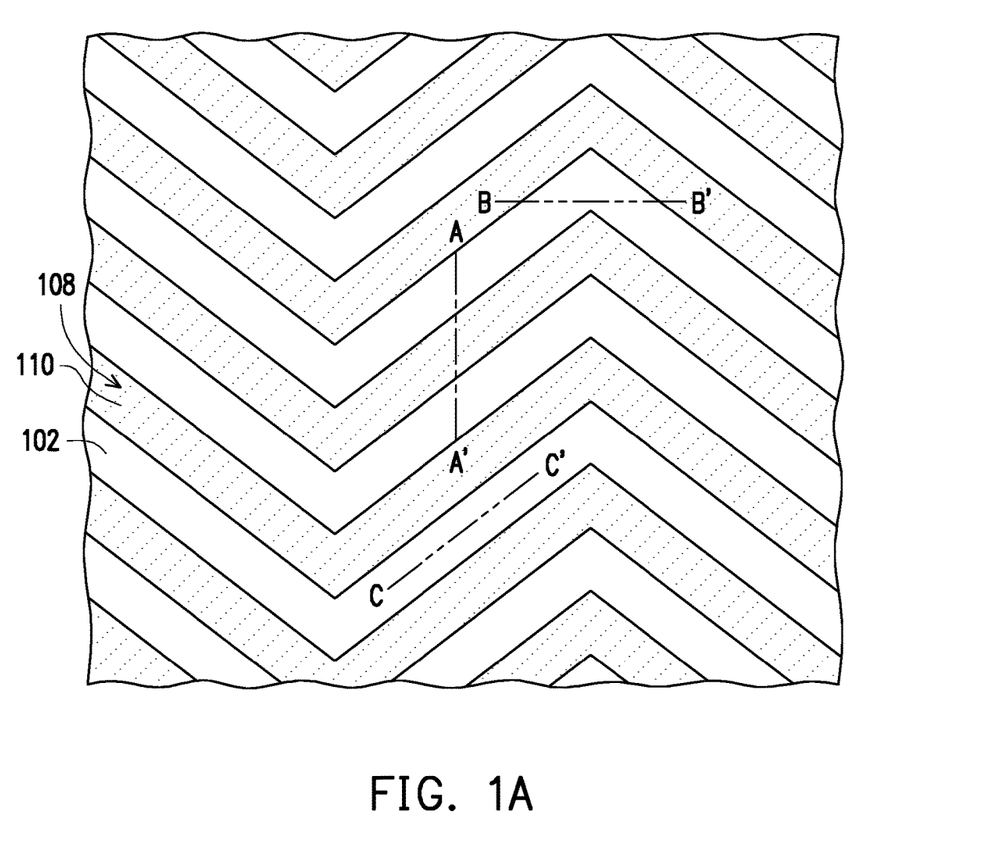
FIG. 1A to FIG. 1E are top views of a manufacturing process of a semiconductor structure according to an embodiment of the invention.
Figure 1B:
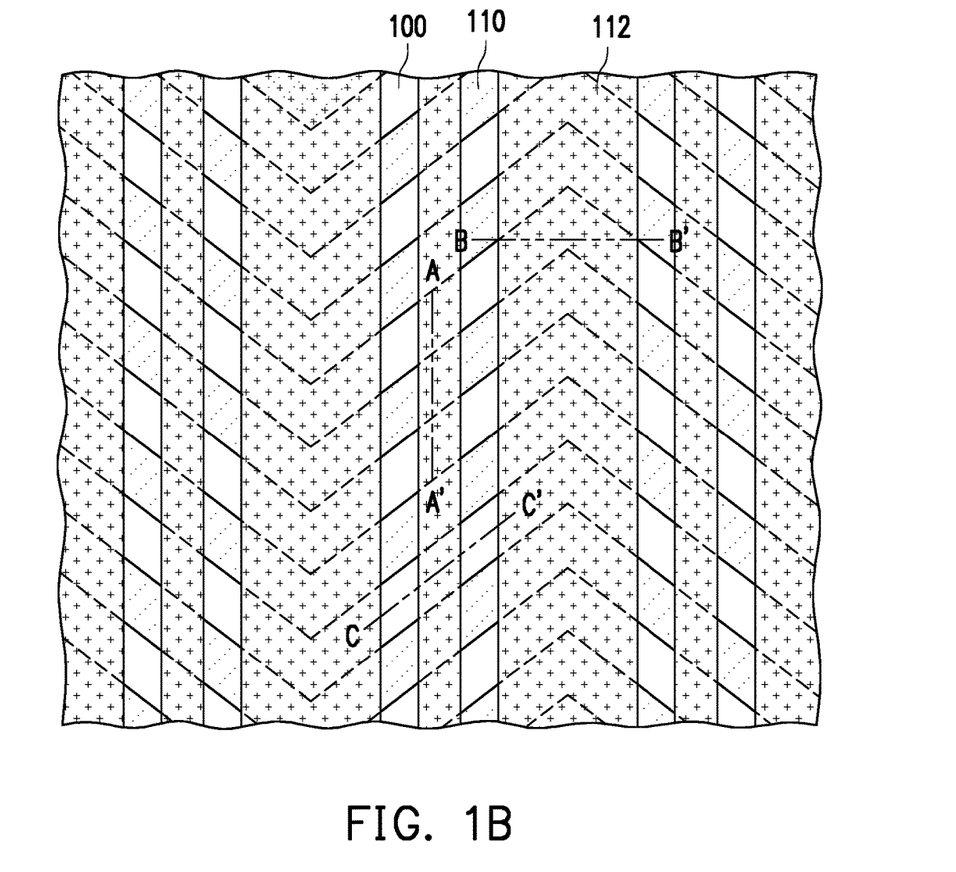
Figure 1C:
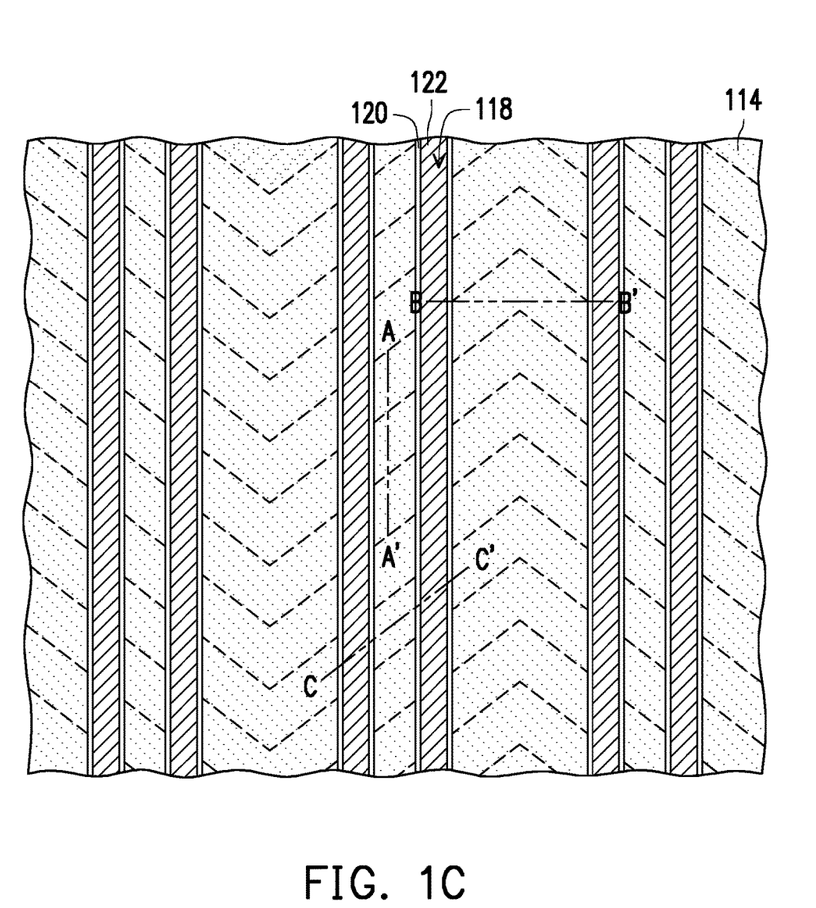
Figure 1D:
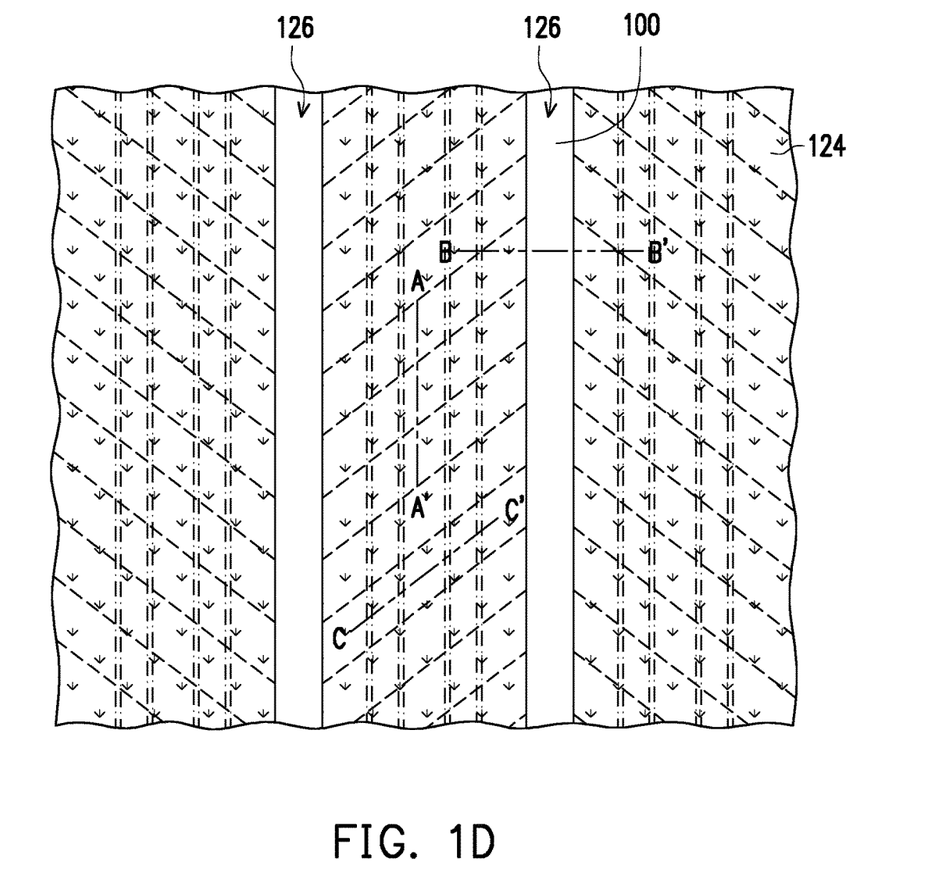
Figure 1E:
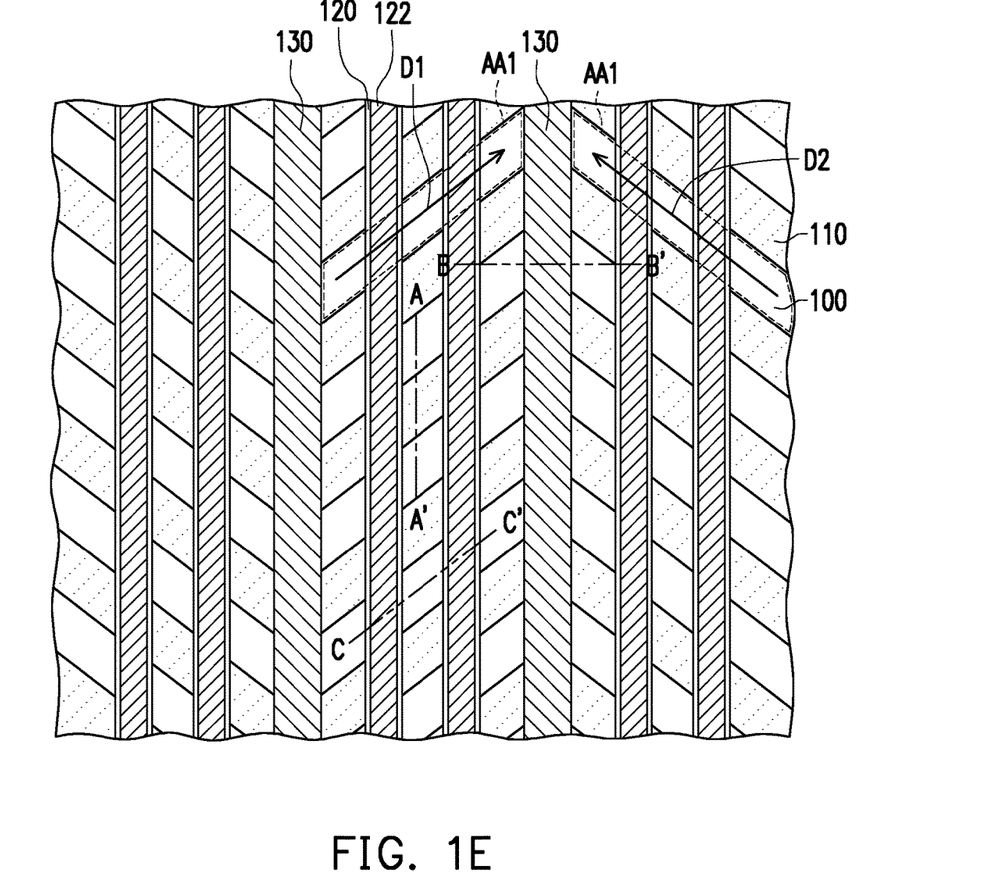
Figure 2A:
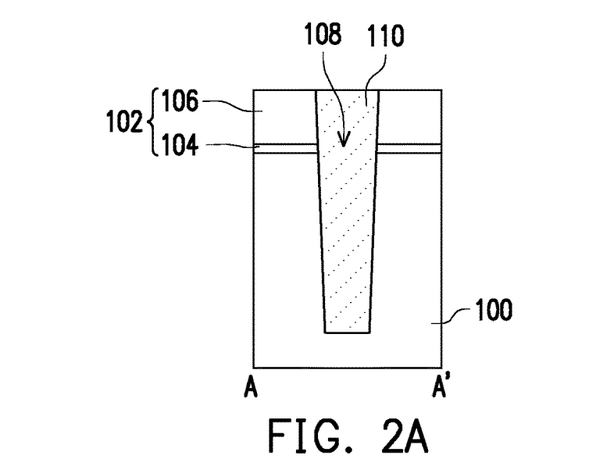
FIG. 2A to FIG. 2E are cross-sectional views taken along section line A-A' in FIG. 1A to FIG. 1E.
Figure 2B:
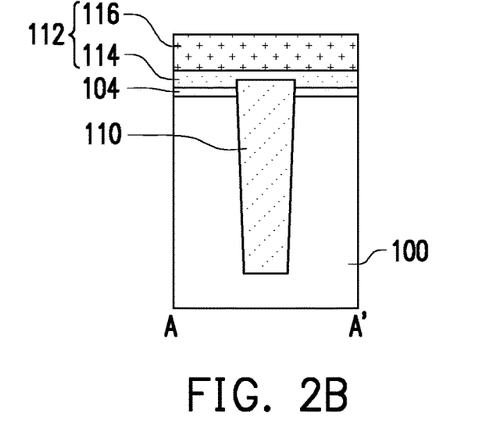
Figure 2C:
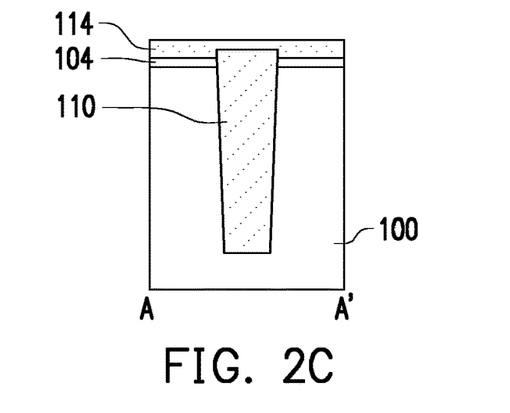
Figure 2D:
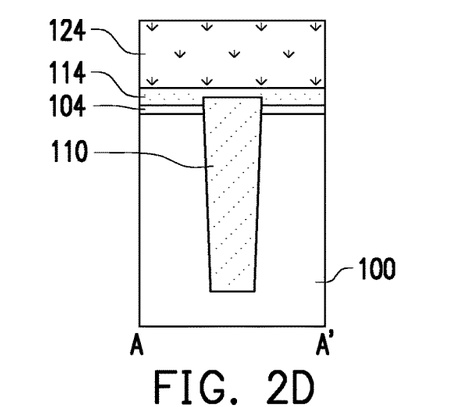
Figure 2E:
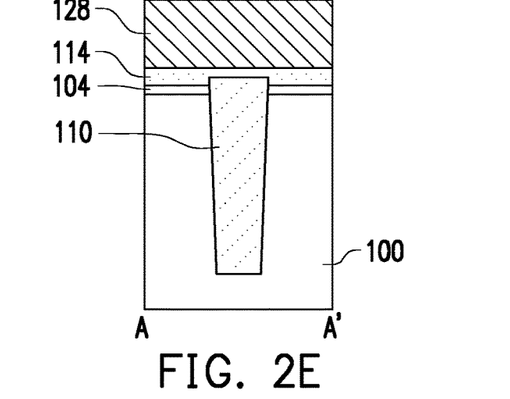

Referring to FIG. 1E, FIG. 2E, FIG. 3E and FIG. 4E, wherein in FIG. 1E, the layers located above the top surface of the substrate 100 and a first isolation layer 128 in the second opening 118 are omitted from illustration for clarification.

Thereafter, the patterned photoresist layer 124 is removed. A method for removing the patterned photoresist layer 124 is, for example, a dry stripping method or a wet stripping method.

Subsequently, the first isolation layer 128 that fills the third opening 126 is formed, and the first isolation layer 128 located in the third opening 126 may be used as a second isolation structure 130. Thereby, after the buried word line 122 is formed, at least one second isolation structure 130 can be formed in the substrate 100. The second isolation structure 130 intersects the first isolation structure 110. In addition, the first isolation layer 128 is partially filled into the second opening 118. A material of the first isolation layer 128 is, for example, nitride such as silicon nitride. A method for forming the first isolation layer 128 is, for example, a CVD method.

A material of at least a portion of the second isolation structure 130 can be different from the material of the first isolation structure 110. For example, the material of the first isolation structure 110 is, for example, oxide (e.g., silicon oxide), and the material of the at least a portion of the second isolation structure 130 is, for example, nitride (e.g., silicon nitride). In the present embodiment, explanation is given of an example in which the material of an entirety of the second isolation structure 130 is different from the material of the first isolation structure 110. However, the invention is not limited thereto.

The first isolation structure 110 and the second isolation structure 130 define active areas AA1. A top-view pattern of the active area AA1 located on one side of the second isolation structure 130 can extend in an extension direction D1 having a positive slope, and a top-view pattern of the active area AA1 located on the other side of the second isolation structure 130 can extend in an extension direction D2 having a negative slope.

In addition, in the case where nitride is used as the material of the second isolation structure 130, hardness required for a surface of the isolation structure can be achieved without performing an annealing process. Therefore, size reduction of the active area AA1 can be prevented, and occurrence of recesses on the second isolation structure 130 can be avoided.

Based on the above embodiments, it is clear that, in the manufacturing method of a semiconductor structure, since the second isolation structure 130 is formed after the buried word line 122 has been formed, the number of thermal processes that the second isolation structure 130 undergoes can be reduced, and the number of processes that may cause recesses on the second isolation structure 130 can be decreased. Therefore, size reduction of the active area AA1 can be effectively prevented, and occurrence of short circuit between the subsequently formed contacts can be avoided. In this way, the manufacturing method of a semiconductor structure can effectively reduce write recovery time of a semiconductor device and improve an operating speed thereof. Moreover, product yield can be improved, and performance and production of the semiconductor device can be further improved. In addition, the manufacturing method of a semiconductor structure may be applied to manufacturing processes of various semiconductor devices (e.g., DRAM).

Hereinafter, the semiconductor structure of the present embodiment is explained with reference to FIG. 1E, FIG. 2E, FIG. 3E and FIG. 4E.

Referring to FIG. 1E, FIG. 2E, FIG. 3E and FIG. 4E, the semiconductor structure includes the substrate 100, first isolation structures 110, at least one buried word line 122 and at least one second isolation structure 130. The first isolation structures 110 are disposed in the substrate 100. The buried word line 122 is disposed in the substrate 100. The buried word line 122 intersects the first isolation structures 110. The second isolation structure 130 is disposed in the substrate 100. The second isolation structure 130 intersects the first isolation structures 110. The material of at least a portion of the second isolation structure 130 is different from the material of the first isolation structures 110. A bottom surface of the at least a portion of the second isolation structure 130 is lower than the top surface of the substrate 100. In addition, the semiconductor structure can further include the gate dielectric layer 120. The gate dielectric layer 120 is disposed between the buried word line 122 and the substrate 100. In addition, the materials, characteristics, forming methods and arrangement manners of each member of the semiconductor structure have been explained in detail in the above embodiment, and will not be repeated herein.

Based on the above embodiments, it is clear that, in the semiconductor structure, since the material of at least a portion of the second isolation structure 130 is different from the material of the first isolation structures 110, size reduction of the active area AA1 can be effectively prevented, and occurrence of short circuit between the subsequently formed contacts can be avoided. In this way, the semiconductor structure can effectively reduce write recovery time of a semiconductor device and improve an operating speed thereof. Moreover, product yield can be improved, and performance and production of the semiconductor device can be further improved.

Figure 5:
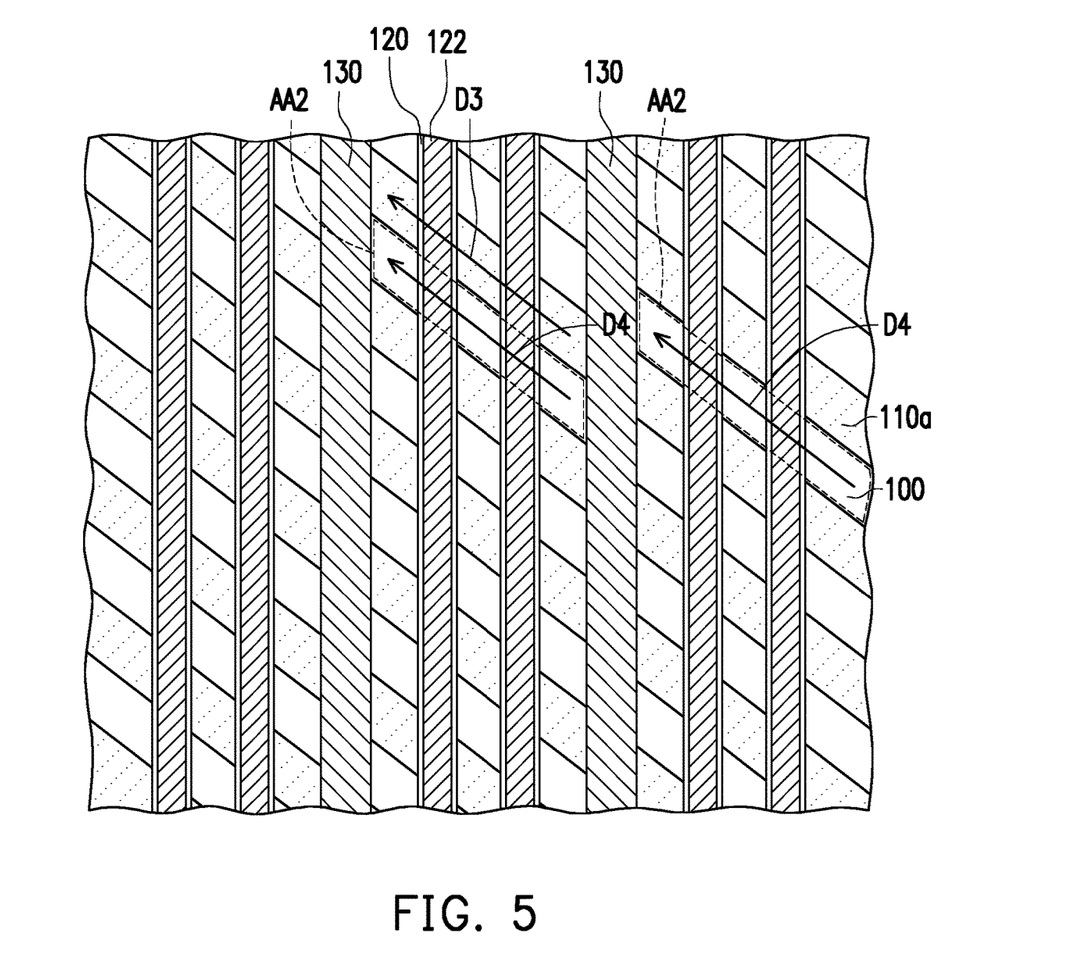
FIG. 5 is a top view of a semiconductor structure according to another embodiment of the invention.

FIG. 5 is a top view of a semiconductor structure according to another embodiment of the invention.

Referring to FIG. 1E and FIG. 5 together, a structural difference between the semiconductor structure of FIG. 5 and the semiconductor structure of FIG. 1E is explained as follows. In the semiconductor structure of FIG. 5, a first isolation structure 110a and the second isolation structure 130 define active areas AA2. Top-view patterns of first isolation structures 110a have the same extension direction D3. Top-view patterns of the active areas AA2 located on one side and the other side of the second isolation structure 130 have the same extension direction D4.

In addition, a difference between the manufacturing method of the semiconductor structure of FIG. 5 and the manufacturing method of the semiconductor structure of FIG. 1E is explained as follows. In the manufacturing method of the semiconductor structure of FIG. 1E, the first patterned hard mask layer 102 having a bent shape is used to form the first isolation structure 110 (see FIG. 1A). However, in the manufacturing method of the semiconductor structure of FIG. 5, a patterned hard mask layer (not illustrated) having a straight shape is used to form the first isolation structure 110a.

Apart from this, the semiconductor structure of FIG. 5 and the semiconductor structure of FIG. 1E have similar effects, and the same members are denoted by the same reference numerals. Therefore, details thereof will not be repeated herein.

Figure 6:
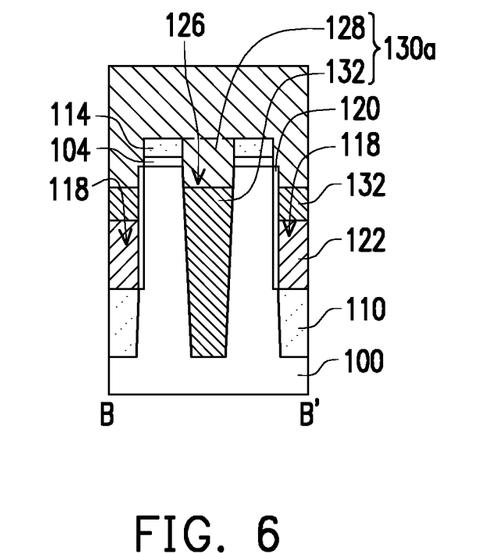
FIG. 6 is a cross-sectional view taken along section line B-B' in FIG. 1E according to another embodiment of the invention.
Figure 7:
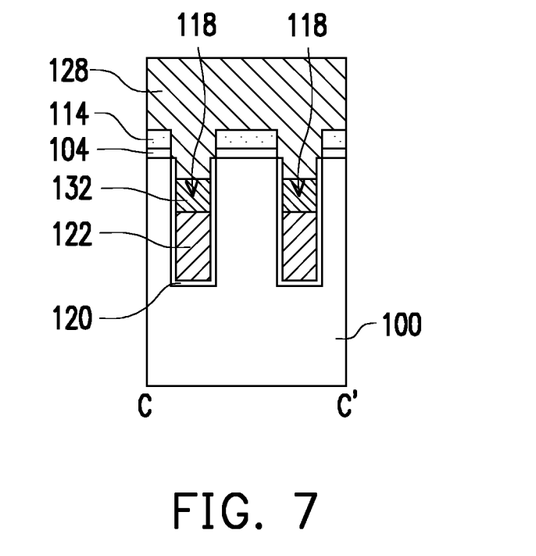
FIG. 7 is a cross-sectional view taken along section line C-C' in FIG. 1E according to another embodiment of the invention.

FIG. 6 is a cross-sectional view taken along section line B-B' in FIG. 1E according to another embodiment of the invention. FIG. 7 is a cross-sectional view taken along section line C-C' in FIG. 1E according to another embodiment of the invention.

Figure 3A:
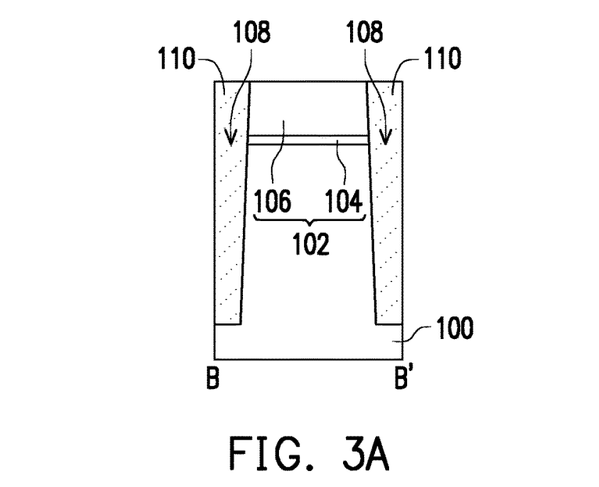
FIG. 3A to FIG. 3E are cross-sectional views taken along section line B-B' in FIG. 1A to FIG. 1E.
Figure 3B:
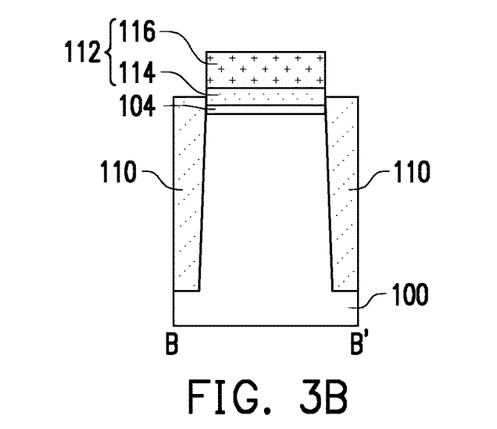
Figure 3C:
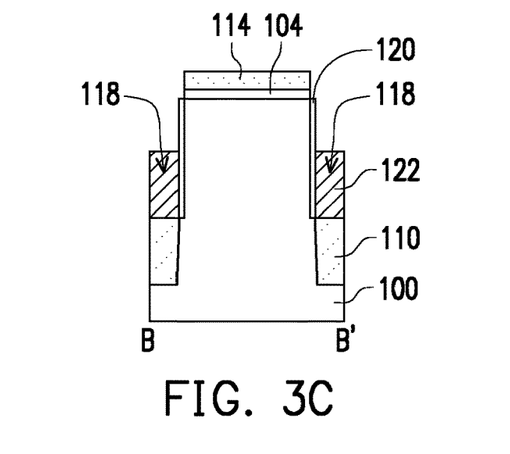
Figure 3D:
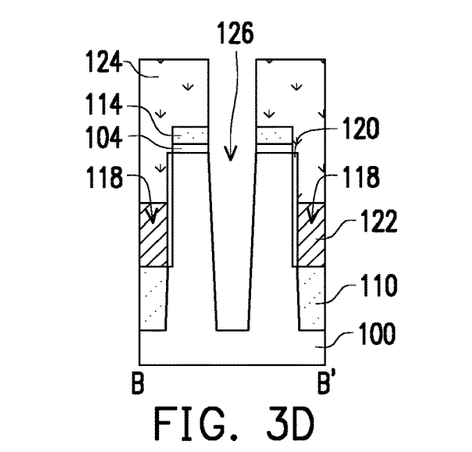
Figure 3E:
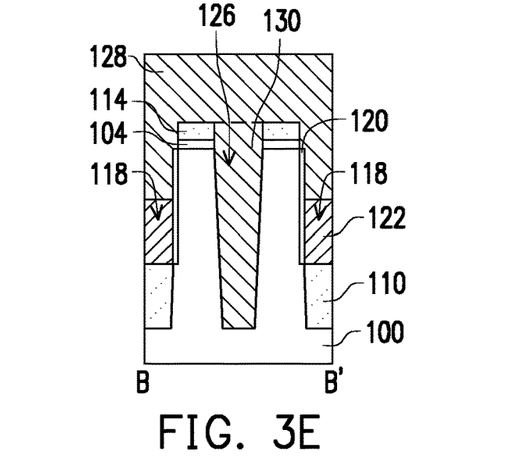
Figure 4E:
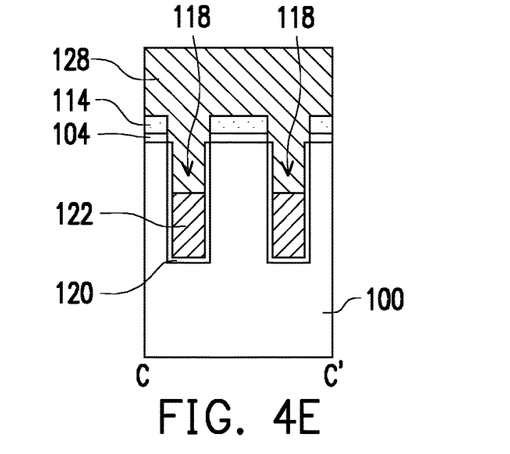

Referring to FIG. 1E, FIG. 3E, FIG. 4E, FIG. 6 and FIG. 7 together, a structural difference between the semiconductor structure of FIG. 6 and FIG. 7 and the semiconductor structure of FIG. 3E and FIG. 4E is explained as follows. In the semiconductor structure of FIG. 6 and FIG. 7, a second isolation structure 130a includes the first isolation layer 128 and a second isolation layer 132 located in the third opening 126. The second isolation layer 132 is located between the first isolation layer 128 and the substrate 100. The material of the first isolation layer 128 is, for example, nitride, and a material of the second isolation layer 132 is, for example, oxide. The material of a top portion (the first isolation layer 128 located in the third opening 126) of the second isolation structure 130a is different from the material of the first isolation structure 110. A bottom surface of at least a portion (e.g., the top portion, i.e., the first isolation layer 128 located in the third opening 126) of the second isolation structure 130a is lower than the top surface of the substrate 100.

In addition, in the case where nitride is used as the material of the first isolation layer 128, the top portion (the first isolation layer 128 located in the third opening 126) of the second isolation structure 130a can have sufficient hardness. Therefore, even if oxide is used as the material of the second isolation layer 132, there is no need to perform an annealing process on the second isolation layer 132 for increasing its hardness. In this way, size reduction of the active area AA1 can be prevented, and occurrence of recesses on the second isolation structure 130a can be avoided. In addition, a dielectric constant of the second isolation layer 132 may be smaller than a dielectric constant of the first isolation layer 128. By selecting the second isolation layer 132 having a lower dielectric constant, insulation characteristics of the second isolation structure 130a can be improved.

In addition, a difference between the manufacturing method of the semiconductor structure of FIG. 6 and FIG. 7 and the manufacturing method of the semiconductor structure of FIG. 3E and FIG. 4E is explained as follows. The manufacturing method of the semiconductor structure of FIG. 6 and FIG. 7 further includes the following step. Before the first isolation layer 128 that fills the third opening 126 is formed, the second isolation layer 132 is formed in the third opening 126. In addition, the second isolation layer 132 can be formed in the second opening 118 at the same time. A method for forming the second isolation layer 132 is, for example, as follows. Firstly, an isolation material layer that fills the second opening 118 and the third opening 126 is formed. Then, the isolation material layer outside the second opening 118 and the third opening 126 is removed. Further, an etch-back process can be performed on the isolation material layer located in the second opening 118 and in the third opening 126. A method for forming the isolation material layer is, for example, a CVD method. A method for removing the isolation material layer outside the second opening 118 and the third opening 126 is, for example, a CMP method. The etch-back process is, for example, a dry etching method. Apart from this, the semiconductor structure of FIG. 6 and FIG. 7 and the semiconductor structure of FIG. 3E and FIG. 4E have similar effects, and the same members are denoted by the same reference numerals. Therefore, details thereof will not be repeated herein.

In summary, by the semiconductor structure and the manufacturing method thereof proposed by the above embodiments, write recovery time of a semiconductor device can be effectively reduced and an operating speed thereof can be improved. Moreover, product yield can be improved, and performance and production of the semiconductor device can be further improved.

Although the invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

What is claimed is:

1. A semiconductor structure, comprising:
   a substrate;
   first isolation structures, disposed in the substrate;
   at least one buried word line, disposed in the substrate, wherein the at least one buried word line intersects the first isolation structures; and
   at least one second isolation structure, disposed in the substrate, wherein the at least one second isolation structure intersects the first isolation structures, a material of at least a portion of the at least one second isolation structure is different from a material of the first isolation structures, a bottom surface of the at least a portion of the at least one second isolation structure is lower than a top surface of the substrate, the material of the first isolation structures comprises oxide, and the material of the at least a portion of the at least one second isolation structure comprises nitride.

2. The semiconductor structure according to claim 1, wherein a top surface of the at least one buried word line is lower than the top surface of the substrate.

3. The semiconductor structure according to claim 1, wherein a material of an entirety of the at least one second isolation structure is different from the material of the first isolation structures.

4. The semiconductor structure according to claim 1, wherein the at least one second isolation structure comprises:
   a first isolation layer; and
   a second isolation layer, located between the first isolation layer and the substrate.

5. The semiconductor structure according to claim 4, wherein a material of the first isolation layer comprises nitride, and a material of the second isolation layer comprises oxide.

6. The semiconductor structure according to claim 1, wherein the first isolation structures and the at least one second isolation structure define active areas, and a top-view pattern of the active area located on one side of the at least one second isolation structure extends in an extension direction having a positive slope, and a top-view pattern of the active area located on the other side of the at least one second isolation structure extends in an extension direction having a negative slope.

7. The semiconductor structure according to claim 1, wherein the first isolation structures and the at least one second isolation structure define active areas, and top-view patterns of the active areas located on one side and the other side of the at least one second isolation structure have the same extension direction.

8. The semiconductor structure according to claim 1, further comprising a gate dielectric layer, disposed between the at least one buried word line and the substrate.

9. A manufacturing method of a semiconductor structure, comprising:
   forming first isolation structures in a substrate;
   forming at least one buried word line in the substrate, wherein the at least one buried word line intersects the first isolation structures; and
   after forming the at least one buried word line, forming at least one second isolation structure in the substrate, wherein the at least one second isolation structure intersects the first isolation structures, a material of at least a portion of the at least one second isolation structure is different from a material of the first isolation structures, the material of the first isolation structures comprises oxide, and the material of the at least a portion of the at least one second isolation structure comprises nitride.

10. The manufacturing method of the semiconductor structure according to claim 9, wherein a method for forming the first isolation structures comprises:
 forming a first patterned hard mask layer on the substrate;
 partially removing the substrate using the first patterned hard mask layer as a mask, and forming first openings in the substrate; and
 forming the first isolation structures in the first openings.

11. The manufacturing method of the semiconductor structure according to claim 10, wherein a shape of the first patterned hard mask layer comprises a bent shape.

12. The manufacturing method of the semiconductor structure according to claim 10, wherein the first patterned hard mask layer is a multilayer structure.

13. The manufacturing method of the semiconductor structure according to claim 10, further comprising performing an etch-back process on the first isolation structures.

14. The manufacturing method of the semiconductor structure according to claim 9, wherein a method for forming the at least one buried word line comprises:
 forming a second patterned hard mask layer on the substrate;
 partially removing the substrate using the second patterned hard mask layer as a mask, and forming at least one second opening in the substrate;
 forming a gate dielectric layer on a portion of a surface of the at least one second opening; and
 forming the at least one buried word line in the at least one second opening.

15. The manufacturing method of the semiconductor structure according to claim 14, wherein the second patterned hard mask layer is a multilayer structure.

16. The manufacturing method of the semiconductor structure according to claim 9, wherein a method for forming the at least one second isolation structure comprises:
 forming a patterned photoresist layer on the substrate;
 partially removing the substrate using the patterned photoresist layer as a mask, and forming at least one third opening in the substrate;
 removing the patterned photoresist layer; and
 forming a first isolation layer that fills the at least one third opening.

17. The manufacturing method of the semiconductor structure according to claim 16, wherein a method for forming the at least one second isolation structure further comprises:
 before forming the first isolation layer that fills the at least one third opening, forming a second isolation layer in the at least one third opening.

18. The manufacturing method of the semiconductor structure according to claim 17, wherein a material of the first isolation layer comprises nitride, and a material of the second isolation layer comprises oxide.

19. The manufacturing method of the semiconductor structure according to claim 10, wherein a shape of the first patterned hard mask layer comprises a straight shape.

20. The manufacturing method of the semiconductor structure according to claim 10, wherein the first patterned hard mask layer is a single-layer structure.

* * * * *